United States Patent
Eichenfield et al.

(10) Patent No.: US 9,865,987 B1
(45) Date of Patent: Jan. 9, 2018

(54) SECOND HARMONIC GENERATION IN RESONANT OPTICAL STRUCTURES

(71) Applicant: National Technology & Engineering Solutions of Sandia, LLC, Albuquerque, NM (US)

(72) Inventors: Matt Eichenfield, Albuquerque, NM (US); Jeremy Moore, Albuquerque, NM (US); Thomas A. Friedmann, Albuquerque, NM (US); Roy H. Olsson, Arlington, VA (US); Michael Wiwi, Albuquerque, NM (US); Camille Padilla, Albuquerque, NM (US); James Kenneth Douglas, Albuquerque, NM (US); Khalid Mikhiel Hattar, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/614,105

(22) Filed: Jun. 5, 2017

(51) Int. Cl.
| | |
|---|---|
| *H01S 3/108* | (2006.01) |
| *G02F 1/37* | (2006.01) |
| *H01S 3/109* | (2006.01) |
| *H05K 3/00* | (2006.01) |
| *G02F 1/355* | (2006.01) |
| *C03C 14/00* | (2006.01) |
| *G02F 1/35* | (2006.01) |

(52) U.S. Cl.
CPC ............ *H01S 3/109* (2013.01); *C03C 14/006* (2013.01); *G02F 1/3517* (2013.01); *G02F 1/3555* (2013.01); *G02F 1/37* (2013.01); *H01S 3/108* (2013.01); *H05K 3/0026* (2013.01); *G02F 1/353* (2013.01)

(58) Field of Classification Search
CPC .......... G02F 1/3517; G02F 1/353; G02F 1/37; H01S 3/108; H01S 3/109
See application file for complete search history.

(56) References Cited

U.S. PATENT DOCUMENTS

| | | | |
|---|---|---|---|
| 8,669,823 B1 * | 3/2014 | Olsson | H03B 5/30 331/154 |
| 9,268,195 B1 * | 2/2016 | Camacho | G02F 1/3536 |

OTHER PUBLICATIONS

A. Rodriguez, M. Soljacic, J. Joannopoulos, and S. Johnson, "x(2) and x(3) harmonic generation at a critical power in inhomogeneous doubly resonant cavities," Opt. Express 15, 7303-7318 (2007).
V. S. Ilchenko, A. A. Savchenkov, A. B. Matsko, and L. Maleki, "Nonlinear optics and crystalline whispering gallery mode cavities," Phys. Rev. Lett. 92 (4), 043903(2004).

(Continued)

*Primary Examiner* — Daniel Petkovsek
(74) *Attorney, Agent, or Firm* — Martin I. Finston (57) ABSTRACT

An optical second-harmonic generator (or spontaneous parametric down-converter) includes a microresonator formed of a nonlinear optical medium. The microresonator supports at least two modes that can be phase matched at different frequencies so that light can be converted between them: A first resonant mode having substantially radial polarization and a second resonant mode having substantially vertical polarization. The first and second modes have the same radial order. The thickness of the nonlinear medium is less than one-half the pump wavelength within the medium.

22 Claims, 9 Drawing Sheets

(56) References Cited

OTHER PUBLICATIONS

V.B. Braginsky, M.L. Gorodetsky, V.S. Ilchenko, "Quality-factor and nonlinear properties of optical whispering-gallery modes," Physics Letters A, vol. 137, No. 7-8, pp. 393-397 (1989).
J.R. Schwesyg, M.C.C. Kajiyama, M. Falk, D.H. Jundt, K. Buse, M.M. Fejer "Light absorption in undoped congruent and magnesium-doped lithium niobate crystals in the visible wavelength range", J. Applied Physics B, vol. 100, No. 1, pp. 109-115 (2010).
Z. Jiangou, Z. Shipin, X. Dingquan, W. Xiu, X. Guanfeng, "Optical absorption properties of doped lithium niobate crystals," Journal of Physics: Condensed Matter, vol. 4, No. 11, pp. 2977-2983 (1992).
D. Redfield, W. J. Burke, "Optical absorption edge of $LiNbO_3$", Journal of Applied Physics, vol. 45, No. 4566 (1974).
R.H. Olsson III, et al., "A high electromechanical coupling coefficient SH0 Lamb wave lithium niobate micromechanical resonator and a method for fabrication", Sens. Actuators A: Phys. (2014).
D.A. Bryan, R.R. Rice, R. Gerson, H.E. Tomaschke, K.L. Sweeney, L.E. Halliburton, "Magnesium-doped lithium niobate for higher optical power applications", Optical Engineering, vol. 24, No. 1 (1985).
B. Kim, J. Nguyen, K. E. Wojciechowski and R. H. Olsson III, "Oven-Based Thermally Tunable Aluminum Nitride Microresonators," IEEE Journal of Microelectromechanical Systems, vol. 22, No. 2, pp. 265-275, Apr. 2013.
Kiang Guo et al., "Second-harmonic generation in aluminum nitride microrings with 2500%/W conversion efficiency," Optica, vol. 3, No. 10 (Oct. 2016) 1126-1131.

* cited by examiner

SECOND HARMONIC GENERATION IN RESONANT OPTICAL STRUCTURES

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The invention relates to nonlinear optical devices for second-harmonic generation.

ART BACKGROUND

Nonlinear optical devices are useful for providing coherent light, especially in spectral regions where laser sources are not readily available. However, the nonlinear light sources in current use that provide sufficient power in the second harmonic for industrial applications are often bulky and inefficient systems that have large power demands. To raise the commercialization potential of such systems, among other reasons, it would be desirable to reduce their size, weight, and power requirements.

SUMMARY OF THE INVENTION

One of the requirements for efficient second harmonic generation (SHG) is effective phase matching between the electromagnetic field at the pump frequency $\omega$ and the field at the second-harmonic frequency $2\omega$. It is known that the birefringence of some materials can be utilized to provide birefringent phase matching at isolated frequencies. We have discovered that by engineering the dimensions of lithium niobate waveguides, and in particular by providing an engineered waveguide thickness that is less one in-material pump wavelength (i.e., the vacuum wavelength divided by the effective refractive index), we can offer an additional range of wavelengths at which phase matching and consequently SHG, as well as the inverse process referred to as spontaneous parametric down-conversion, are possible. In examples, we utilize resonant phenomena in a lithium niobate whispering-gallery-mode resonator.

Accordingly, an embodiment of the invention in a first aspect is an optical apparatus for generating an output wave that has a converted frequency of twice or one-half the frequency of a pump wave. The apparatus includes a microresonator having a nonlinear optical medium with a thickness $\delta$ and an optical coupler. The microresonator has at least a first resonant mode and a second resonant mode. The optical coupler is effective for injecting the pump wave into the microresonator from a pump source, thereby to excite the first or second mode.

The first and second modes have the same radial order, which is an integer at least 1, but the first mode has substantially radial polarization whereas the second mode has substantially vertical polarization. The frequency associated with the second mode is substantially twice the frequency associated with the first mode. The thickness $\delta$ is less than one-half the in-material wavelength of the pump for propagation within the nonlinear optical medium. In embodiments, the thickness $\delta$ is less than 1/3.5 times the in-material pump wavelength.

In this regard, the following DEFINITIONS apply:

A mode has substantially radial polarization if more than one-half its energy corresponds to a polarization component having a radially directed electric field vector.

A mode has substantially vertical polarization if more than one-half its energy corresponds to a polarization component having a vertically directed electric field vector.

A frequency $f_2$ associated with a second mode of a resonator is substantially twice a frequency $f_1$ associated with a first mode of the resonator if $f_2=2f_1$ without tuning, or if the condition in which $f_2=2f_1$ can be reached through tuning of the resonator.

In embodiments, a tuning circuit is coupled to the microresonator and configured to tune the microresonator over an operating range, wherein the second-mode frequency is precisely twice the first-mode frequency at least at one tuning state within the operating range.

In embodiments, the nonlinear optical medium consists essentially of lithium niobate. By "consists essentially" is meant that the optical properties of the nonlinear optical medium, insofar as they are material to the operation of the device, are attributable to lithium niobate.

In various embodiments, the microresonator is a microring, microdisk, or spherical resonator.

In embodiments, the microresonator is periodically poled.

In embodiments, a sensing element is optically coupled to an output path from the microresonator and configured to provide an output signal indicative of an optical power level, and the tuning circuit is configured to tune the frequencies of the first and second modes in response to the output signal from the sensing element. In further embodiments, the tuning circuit comprises an electric heater in thermal contact with the microresonator for thermo-optical tuning and a voltage bias electrode in electrical communication with the microresonator for electro-optical tuning.

In embodiments, second-harmonic light is generated from the pump light. In other embodiments, output light at one-half the frequency of the pump light is generated by spontaneous parametric down-conversion.

An embodiment of the invention in a second aspect is a method of optical conversion from a pump wave to an output wave that has a converted frequency of twice or one-half the frequency of a pump wave. According to such method, the pump wave is injected into a microresonator that comprises a nonlinear optical medium having a thickness $\delta$, wherein the injecting is performed so as to excite a first resonant mode of the microresonator at a first-mode resonant frequency; and the microresonator is tuned so as to create a tuning state in which a second resonant mode of the resonator has a frequency that is twice or one-half the frequency of the first resonant mode.

One of the first and second modes has substantially radial polarization and the other has substantially vertical polarization, but both modes have the same radial order which is an integer at least 1. The pump wave and each of the modes has a respective in-material wavelength for propagation within the nonlinear optical medium. The thickness $\delta$ is less than one-half, and in embodiments less than 1/3.5 times the in-material pump wavelength.

DETAILED DESCRIPTION

Introduction. It is well known from the theory of nonlinear optics that even in a material (such as lithium niobate) that has a large second-order nonlinear susceptibility, there will be substantial conversion of optical power from the pump frequency f to the second-harmonic frequency 2f only if the phase-matching condition is at least approximately satisfied. That is, the interacting waves must maintain a fixed phase relationship as they co-propagate.

Given a pair of waveguide modes at the frequencies f and 2f with respective wavevectors $k_f$ and $k_{2f}$, this condition is satisfied only if the phase difference $\Delta k$, defined by $\Delta k = 2k_f - k_{2f}$, is equal to zero. Equivalently, the respective refractive indices $n_f$ and $n_{2f}$ must be equal.

When there is phase mismatch, i.e., when $\Delta k$ is non-zero, the field generated at 2f (i.e., the second-harmonic or "SH" field) will go out of phase with the pump field by 180° over a propagation distance $L_{coh}$, referred to as the coherence length. That is, $\Delta k \cdot L_{coh} = \pi$. As a consequence, the conversion efficiency for second-harmonic generation (SHG) will oscillate as a function of propagation distance. It will oscillate between zero and a maximum value $P_{2\omega,max}$ with a period of $L_{coh}$. (The symbol $\omega$ is the frequency in radians per second; i.e., $\omega = 2\pi \cdot f$.) The quantity $P_{2\omega,max}$ scales approximately as $(\Delta k)^{-2}$, which implies that the total power that can be converted by SHG is severely limited in the absence of good phase matching.

Figure 1:
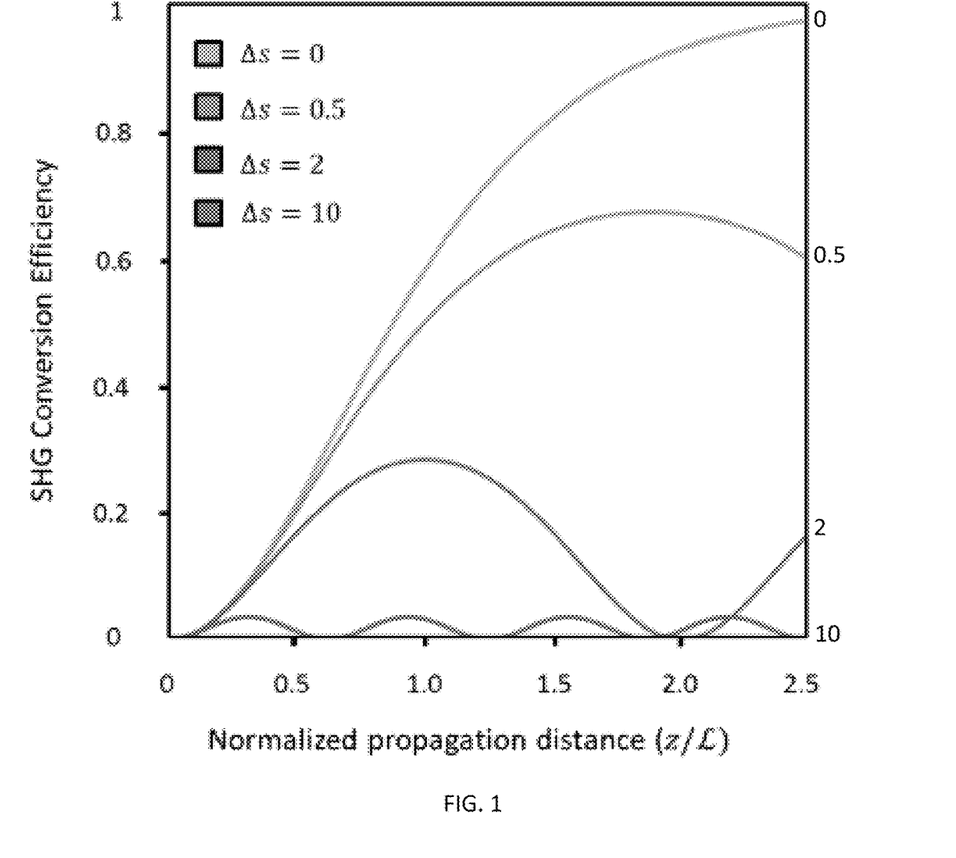
FIG. 1 is a theoretical graph of conversion efficiency for second-harmonic generation, plotted as a function of a normalized propagation distance. A family of curves is plotted in the figure, each curve corresponding to a respective value of a normalized phase-mismatch parameter $\Delta s$.

FIG. 1 is a graph of the SHG conversion efficiency as a function of propagation distance normalized to a characteristic distance $\mathcal{L}$ which is described below. A family of curves is plotted in the figure, each curve corresponding to a respective value of the normalized phase-mismatch parameter $\Delta s$, which in the figure assumes the values 0, 0.5, 2, and 10. The parameter $\Delta s$ is defined by $\Delta s = \mathcal{L} \cdot \Delta k$. Accordingly, it will be seen in the figure that as the phase mismatch increases (i.e., as $\Delta s$ increases), the conversion efficiency drops sharply.

The parameter $\mathcal{L}$ is the characteristic distance over which the pump and SH fields would exchange energy in the absence of phase mismatch. In terms of the intensity $I_f$ of the pump at the device input, the refractive indices $n_1$ and $n_2$ of the material for the respective electromagnetic fields, the pump frequency f, and the effective nonlinearity $d_{eff}$ of the material (as expressed in picometers per volt), $\mathcal{L}$ is given by the expression:

$$\mathcal{L} = \left( \frac{2n_1^2 n_2}{\varepsilon_0 c I_\omega} \right)^2 \frac{c}{2\omega d_{eff}}. \tag{1}$$

In the above equation, the symbols c and $\varepsilon_0$ have their usual meanings as the vacuum velocity of light and the permittivity of free space, respectively. The symbol $\omega$ is equal to the pump frequency in radians per second, i.e., $2\pi \cdot f$.

One well-known method of compensating for phase mismatch is quasi-phase matching (QPM), in which the optic axis of the crystal structure is periodically inverted about a plane normal to the propagation direction in order to rephase the fields in discrete steps. An implementation of this practice using bias electrodes is referred to as periodic poling. Although useful, QPM has a tendency to reduce the effective nonlinearity of the optical material, which in turn even more steeply reduces the power conversion rate. This can place a limit on the amount of SH light that can be produced using a low-power pump.

Another known method of compensating for phase mismatch is birefringent phase matching (BPM), which utilizes the propensity of anisotropic nonlinear materials to exhibit two or more different indices of refraction for orthogonally polarized optical waves propagating in a given direction. In fortuitous circumstances, a pair of harmonic frequencies with orthogonal polarizations can be found that have the same index of refraction. However, this is a very restrictive set of conditions, and it generally leads to a very small range of frequencies that can be achieved by SHG. In $LiNbO_3$ at room temperature, for example, BPM can phase match the pump at a wavelength of 1074 nm to the SH field at 537 nm.

Figure 2:
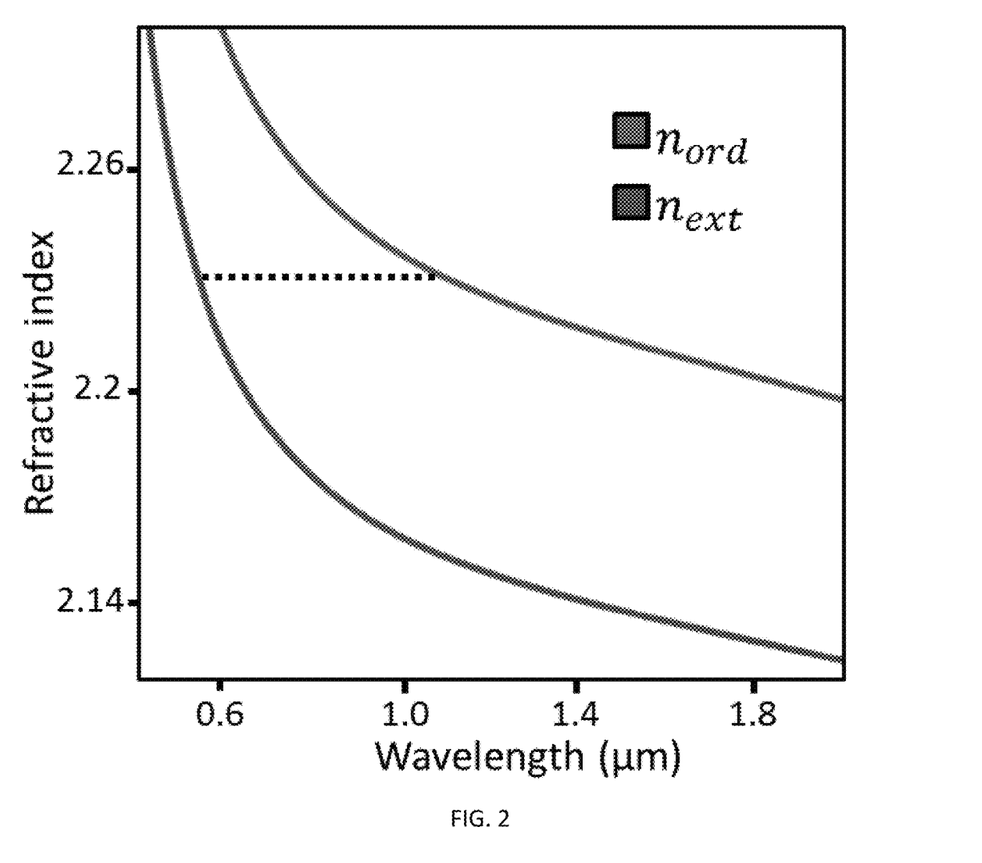
FIG. 2 is a graph of refractive index versus wavelength for lithium niobate at room temperature. Two chromatic dispersion curves are plotted. The upper curve is the curve of normal chromatic dispersion for ordinary polarization, and the lower curve is the curve of normal chromatic dispersion for extraordinary polarization.

By way of illustration, FIG. 2 is a graph of refractive index versus wavelength for lithium niobate at room temperature. Two chromatic dispersion curves are plotted. The upper curve is the curve of normal chromatic dispersion for ordinary polarization, and the lower curve is the curve of normal chromatic dispersion for extraordinary polarization. The broken horizontal line in the graph indicates that there is a refractive index match between the ordinary curve at 1074 nm and the extraordinary curve at half that wavelength, i.e., at 537 nm.

Because birefringence and normal dispersion in lithium niobate are very sensitive to temperature, the BPM in this material can be tuned with temperature over a modest range of wavelengths. In a lithium niobate crystal at 100° C., for example, a phase match for SHG can be achieved between wavelengths of 555 nm and 1110 nm. At −100° C., a phase match for SHG can be achieved between wavelengths of 520 nm and 1040 nm.

However, the short-wavelength limit for phase matching for SHG in lithium niobate by thermal tuning at low temperatures occurs approximately at the wavelength pair at 505 nm and 1010 nm. Beyond this, the crystal cannot be cooled further to phase match shorter wavelength pairs. As a consequence, BPM as it is conventionally practiced is not a viable approach for generating SH light at shorter wavelengths, and particularly at wavelengths in the near-ultraviolet range such as 369 nm.

Geometric Birefringent Phase Matching.

Our new approach, which we refer to as geometric birefringent phase matching (gBPM), is to use engineered waveguide dimensions to create birefringence having desired characteristics. Our object is to create two orthogonally polarized modes that satisfy the phase-matching condition at respective frequencies f and 2f.

In a simple example, an air-clad dielectric slab waveguide of a suitable nonlinear material has a transverse electric (TE) mode and a transverse magnetic (TM) mode. We would seek a waveguide geometry that would yield $k_{TM}(f_{TM})=2 \cdot k_{TE}(f_{TE})$, with $f_{TM}=2f_{TE}$.

It should be noted in this regard that in a thick waveguide, the waveguide modes are strongly confined to the lithium niobate, and the effective indices of refraction of the two modes approach their bulk values. For thinner waveguides, the modes are forced outside the waveguide into the air, lowering their effective indices. In particular, the electromagnetic boundary conditions require the electric field component in the TM mode (which is normal to the air-dielectric interface) to be discontinuous across the interface, with a greater value just outside the dielectric than the value just inside the dielectric. The effective index for TM modes is therefore a stronger function of thickness than the effective index for TE modes. For thin waveguides, in fact, the effective index of a TM second harmonic mode can be depressed enough to equal the effective index of a TE pump mode, thus completely compensating for material dispersion.

According to modeling studies assuming a pump wavelength of 1550 nm and a lithium niobate slab geometry, the effective indices of the TE and TM modes become equal at a thickness of 184 nm. That is evident from FIG. 3, which is a graph of mode effective index as a function of waveguide thickness for the pump TM and TE modes and for the second harmonic TM and TE modes. Each of these four cases is represented by a respective plotted curve.

Figure 3:
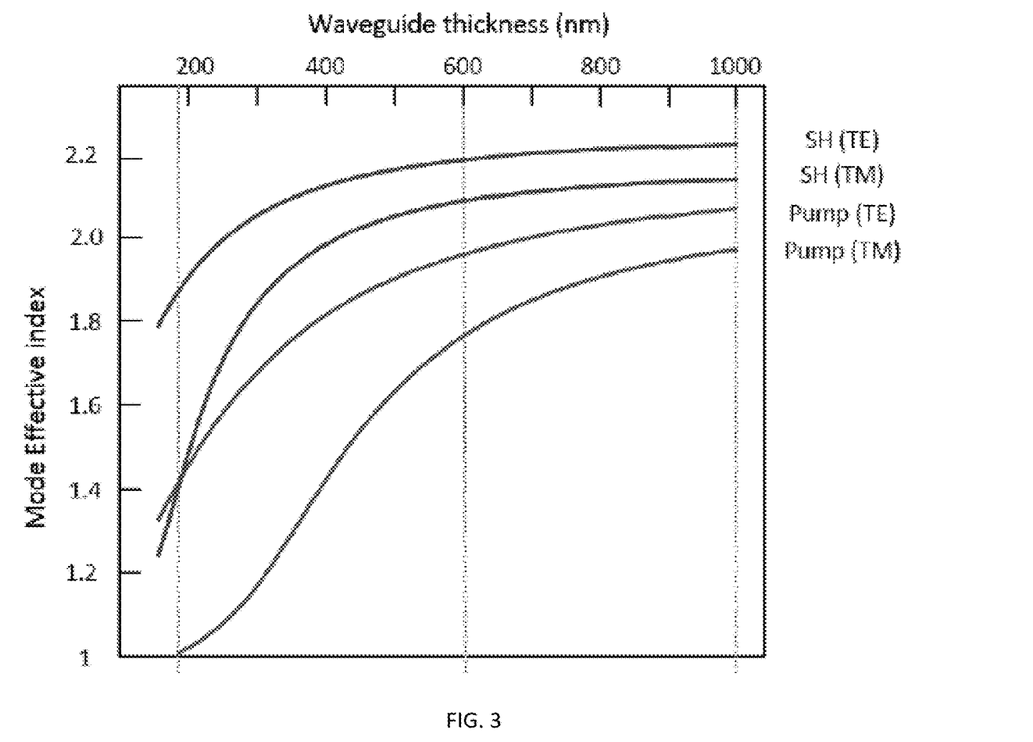
FIG. 3 is a graph of mode effective index as a function of thickness in a lithium niobate waveguide for e pump TM and TE modes and for second-harmonic TM and TE modes. Each of these four cases is represented by a respective plotted curve.

It will be seen that the pump TE curve and the second-harmonic TM curve intersect at the waveguide thickness of 184 nm. Consequently, a suspended thin film lithium niobate waveguide with a width (in this example) of 1.5 μm and a thickness of 184 nm can be perfectly phase matched for SHG from a pump wavelength of 1550 nm to a second harmonic wavelength of 775 nm using gBPM.

However, concentrating too much of the SH mode's optical power in the spatial region outside the dielectric can reduce the effective nonlinearity of the system. Moreover, the modal overlap between the respective modes and between each mode and the nonlinear material must be great enough for efficient SHG. These factors, among others, raised doubts as to the feasibility of our idea. As will be seen below, these doubts have been overcome.

gBPM in Whispering Gallery Mode Resonators.

For highly efficient conversion to SH light, it is desirable to replace the slab waveguide by a high-finesse optical cavity resonator. Such an arrangement offers a double advantage: First, the circulating power of the pump will be multiplied by the finesse of the resonator. Second, the SHG light can build up over many round-trips through the resonator. The combination of these two enhancements can lead to significantly more efficient generation of SHG light.

To have high finesse at both f and 2f an extremely broadband cavity is needed. Such a cavity is readily provided by total internal reflection in a whispering gallery (WG) resonator, such as a microdisk resonator.

In fact, the modeling and experimental studies that we discuss below were based on the geometry of a microdisk resonator. However, we believe that our findings are applicable to any resonator that possesses azimuthal symmetry, i.e. rotational symmetry about an axis. This would also include microring resonators and spherical resonators. Further, we believe that our findings are applicable even to elliptical resonators and the like; i.e. resonators that support standing waves that circulate along a closed curved path but do not possess strict rotational symmetry. (However, the modal structures of such resonators will generally be more complex than the modal structures of azimuthally symmetric resonators, due to the resolution of certain modal degeneracies.)

The following discussion will take azimuthally symmetric resonators, and particularly microdisk resonators, as an example. However, the various types of resonators referred to above are not excluded, and they should be understood as falling within scope of the present invention, even if their modal behavior deviates somewhat from pure WG behavior.

As explained above, it is necessary for SHG to achieve phase matching in the resonator. The resonant fields in a WG resonator having cylindrical symmetry, for example, are described by two mode numbers: an azimuthal eigenvalue m and a radial eigenvalue n. The number of nodes along the radius is equal to n−1.

The phase matching requirement implies that the matched modes at frequencies ω and 2ω must have azimuthal eigenvalues (i.e., azimuthal mode orders) m and 2m, respectively. This is equivalent to the requirement that the propagation constants of the phase-matched modes must assume values that allow them to be resonant simultaneously.

In the above-described model system based on a linear slab waveguide, the modes having mutually orthogonal polarizations were a TE mode and a TM mode. In our new geometry, based on a microring or microdisk, the analogous modes have radial (the mode at f) and vertical (the mode at 2f) polarizations. It will be understood that these polarizations are still respectively "horizontal" (in the sense that the electric field in the radial mode is directed parallel to the substrate) and "vertical" (in the sense that the electric field in the vertical mode is directed normal to the substrate).

More broadly, we will refer to any mode as having "substantially radial" polarization if more than one-half its energy corresponds to a polarization component having a radially directed electric field vector, and we will refer to any mode as having "substantially vertical" polarization if more than one-half its energy corresponds to a polarization component having a vertically directed electric field vector.

In order to achieve the greatest possible conversion efficiencies at low power, we have found it best (for reasons explained below) to use the modes that have a radial eigenvalue n that equals 1; i.e., the modes that have no nodes disposed along the radius of the resonator. As will be seen, we found that through gBPM, it is possible to create a mode structure that permits the phase matching of resonator modes with n=1 for both the pump mode and the second-harmonic mode.

Our findings are not limited to those modes that have a radial eigenvalue of 1, however. We believe that useful results may be obtained for higher radial orders, provided only that the pump mode and the second-harmonic mode both have the same radial eigenvalue, so that there is good overlap between them.

One advantage of the n=1 modes is that they give the largest possible modal overlap between the modes with respective azimuthal eigenvalues m and 2m. This allows the most efficient use of material nonlinearity, and it correspondingly increases the efficiency of SHG at a given input power level.

The second advantage relates to the practical consideration that the SH output light will typically be extracted from the resonator by evanescent coupling to a laterally coupled waveguide. Such a waveguide will be most strongly coupled to optical modes that have no radial nodes. Coupling to other modes will grow successively weaker as the respective number of radial nodes increases.

Moreover, the overall efficiency for extraction of SH light is limited by the competition between the cavity loading rate and the intrinsic loss rate, both for mode m and for mode 2m. This upper limit is greater if the radial modes are limited to n=1. This is especially pertinent to the 2m mode, which has a shorter wavelength (and thus has less extent outside the resonator), and which generally has a lower quality factor Q due to increased susceptibility to scattering caused by surface roughness.

It should be noted in this regard that the thickness of the microdisk resonator is a critical factor for achieving doubly-resonant SHG between orthogonally polarized n=1 modes. For example, we found that it was necessary to have a thickness below 200 nm in order to achieve SHG between resonator modes with wavelengths of 1550 nm and 775 nm. In fact, the radius is also critical. We found that for a given thickness and a given m, only one radius will exactly phase match the m and 2m modes, but there is a critical thickness above which no radius can produce a phase match.

It will be understood from the discussion herein that our experimental and theoretical studies were directed primarily to microdisk resonators in which the nonlinear optical medium was lithium niobate in a suspended membrane geometry. The choice of lithium niobate, however, should be understood as a non-limiting example. Any of various other nonlinear optical materials are also believed to be effective in the present context. The primary requirement is that the nonlinear medium can be formed into a thin film that is either deposited (or bonded) on a low-refractive-index cladding, or else suspended so that it is clad by vacuum, air, or another gas. Suspension may be brought about, for example, by undercutting with the use of suitable etching techniques. Two examples of alternative nonlinear optical materials are lithium tantalate and aluminum nitride.

Design.

From our modeling studies and experiments on microring resonators, we found that the thickness of the non-linear medium that constitutes the resonator should be less than one-half the wavelength of the pump light in the nonlinear medium, and preferably less than 1/3.5 times that wavelength. The wavelength referred to here is the vacuum wavelength divided by the effective refractive index of the medium. There may be instances in which this requirement can be relaxed slightly, if the mode profile has an evanescent tail that extends substantially outside the nonlinear medium.

Figure 4A:
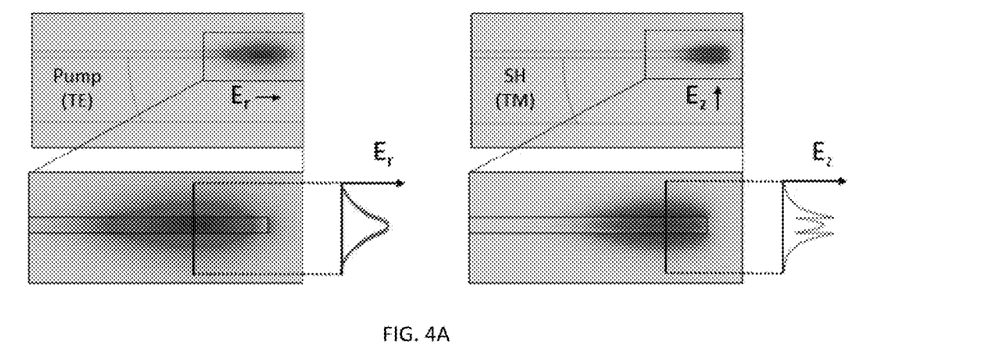
FIG. 4A is a sketch, in side-elevational sectional view, of an exemplary microdisk geometry that was a basis for our numerical modeling. Examples of mode profiles obtained by simulation are indicated on the figure. In each image, only the right-hand half of the microdisk is shown.

Turning now to FIG. 4A, there is provided a sketch, in side-elevational sectional view, of an exemplary microdisk geometry that was a basis for numerical modeling by finite element method (FEM) simulation. Mode profiles obtained by simulation are indicated on the figure for a radial-polarization pump mode at 193.4 THz (left-hand image) and for a vertical-polarization second harmonic at 386.8 THz (right-hand image). In each image, only the right-hand half of the microdisk is shown.

Figure 4B:
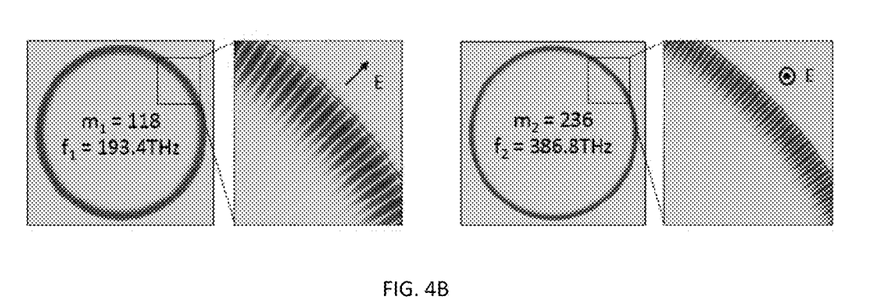
FIG. 4B is a plan view of the microdisk and mode patterns of FIG. 4A, with the pump field illustrated on the left and the second-harmonic field illustrated on the right.

FIG. 4B is a plan view of the same microdisk and mode patterns, with the pump illustrated on the left and the second harmonic illustrated on the right. As indicated in the figure, the mode orders $m_1$ (for the pump) and $m_2$ (for the SH) were 118 and 236, respectively.

Figure 5:
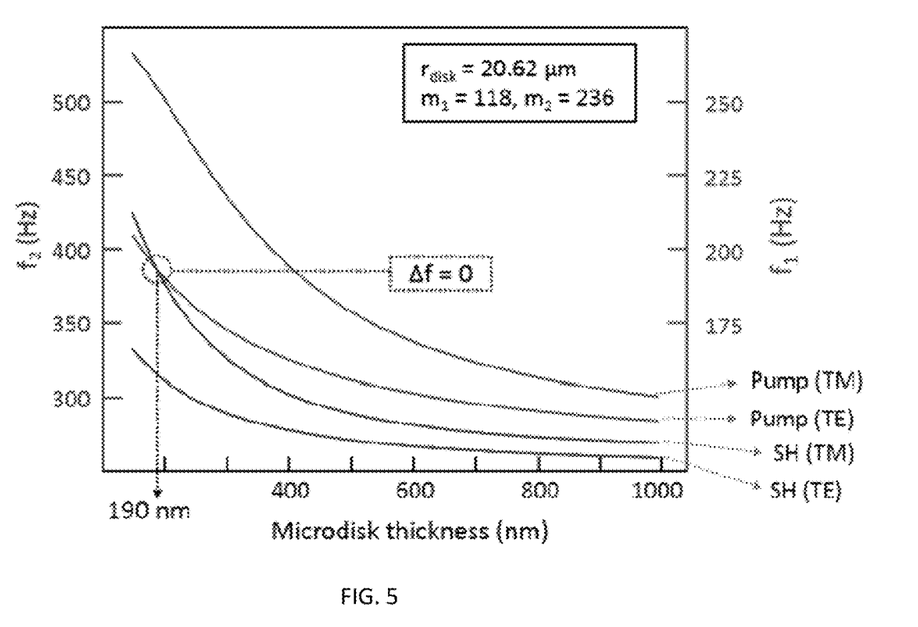
FIG. 5 provides a graphical illustration of our methodology for designing lithium niobate thin-film microdisks with geometrical phase-matching for second-harmonic generation.

FIG. 5 is illustrative of our methodology for designing lithium niobate thin-film microdisks with gBPM for second-harmonic generation. The methodology relies on FEM simulation to determine the eigenfrequencies $f_1$ and $f_2$ for the pump and SH modes for various disk geometries and $m_1$-$m_2$ pairs.

An example procedure begins by selecting a target disk thickness near 200 nm. We simulated microdisks with varying radii and with varying $m_1$-$m_2$ pairs for which $m_2=2m_1$.

For each $m_1$-$m_2$ pair, we calculated $\omega_1$ and $\omega_2$, for each polarization, as a function of thickness.

We changed the radius to a new value and repeated the process until a pump and SH mode were found that satisfied the phase-matching condition and that were within our desired optical frequency ranges.

As seen in the figure, an example phase match was identified in a microdisk 190 nm thick and having a radius of 20.62 μm. The phase match was between a TE (more properly, "radial") pump mode at $f_1$=193.41 THz, $m_1$=118, and a TM (more properly, "vertical") SH mode at $f_2$=386.83 THz, $m_2$=236.

Figure 6:
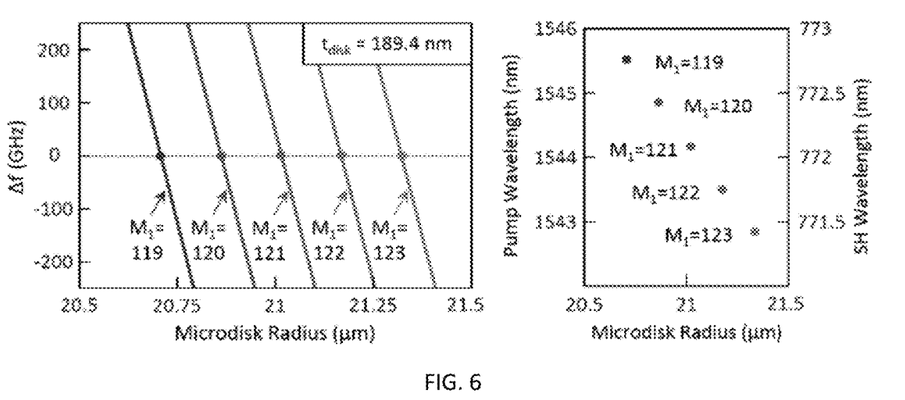
FIG. 6 provides a further illustration of the methodology of FIG. 5. In the left-hand part of the figure, the difference $\Delta f = f_2 - 2f_1$ in a microdisk is plotted as a function of the microdisk radius. Five curves are plotted, each corresponding to a respective value of the azimuthal mode order for the pump field. The y-intercepts, i.e. the points where the respective curves cross the horizontal line $\Delta f = 0$, show where there are phase matches.

FIG. 6 provides a further illustration of our methodology. In the left-hand part of the figure, the difference $\Delta f=f_2-2f_1$ in a microdisk of thickness 189.4 nm is plotted as a function of the microdisk radius. Five curves are plotted, each corresponding to a respective value of the azimuthal mode order for the pump field. They-intercepts, i.e. the points where the respective curves cross the horizontal line $\Delta f=0$, show where there are phase matches.

For example, it is evident from the figure that a microdisk with radius 21.016 μm is phase matched with the following values: $m_1$=121, $m_2$=242; $f_1$=194.15 THz ($\lambda_1$=1544.15 nm), $f_2$=388.29 THz ($\lambda_2$=772.075 nm).

The right-hand part of FIG. 6 plots individual points, each of which corresponds to a respective one of the y-intercepts in the left-hand part of the figure. Each of the plotted points thus corresponds to a value of the microdisk radius (horizontal axis) and a value of the pump wavelength (left-hand vertical axis) and of the second-harmonic wavelength (right-hand vertical axis). Each of the plotted points is labeled with the corresponding pump mode order.

Fabrication.

An example fabrication process for suspended microstructures in lithium niobate is based on ion implantation of a bulk wafer. Patterning and etching through the surface layer to a buried, ion-damaged layer defines the structures. The structures are then released by undercut etching, which selectively attacks the ion-damaged layer.

Figure 7:
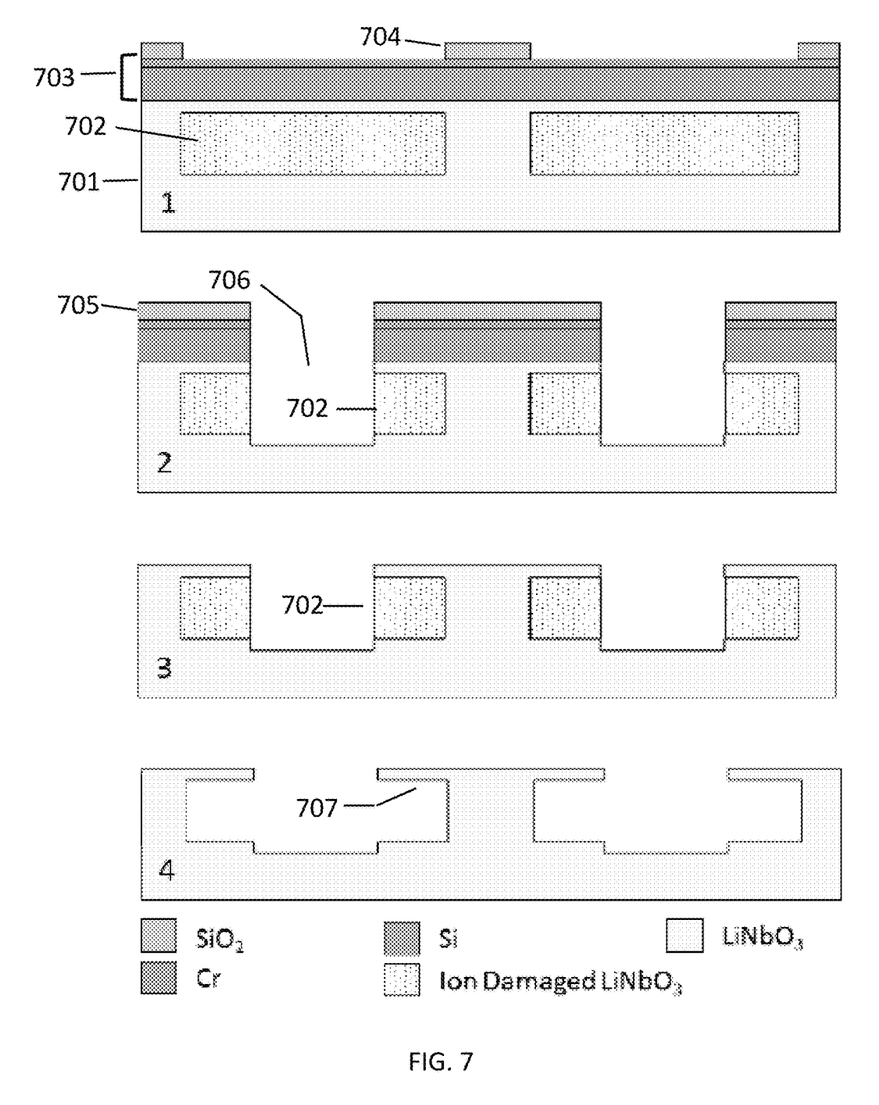
FIG. 7 is an illustration of an example process for fabricating a microresonator according to the principles described here.

Fabrication steps are depicted in FIG. 7. A Z-cut lithium niobate wafer 701 is implanted with a 350-keV, $1.0 \times 10^{16}$ $cm^{-2}$ dose of helium ions, creating a buried layer of damaged lithium niobate 702. A chromium-silicon protect layer 703, Cr/Si (500 Å/2000 Å), is used to protect the wafer surface and control the penetration depth of the ions. A $SiO_2$ hard mask 704 prevents implantation in areas that will become support posts. Silicon dioxide is deposited on the chromium, silicon, and lithium niobate as a second hard mask 705. Resist is spun on the silicon dioxide and photolithographically patterned.

The resist pattern is transferred to the silicon dioxide hard mask 705 by a first reactive ion etch. A second reactive ion etch transfers the hard mask pattern 706 deep into the lithium niobate, past the damaged layer. The chromium and silicon are removed.

Finally, etching in HF undercuts into the ion-damaged lithium niobate to create the microdisk structure 707.

We used this technique to fabricate microdisks with diameters ranging from 10-25 µm, with final thicknesses from 165-400 nm as measured by scanning electron microscopy.

The fabrication process described above can be simplified, and several steps omitted, by starting with a lithium-niobate-on-insulator substrate in which a thick lithium niobate film is deposited on top of a 2-µm layer of silicon oxide. Wafers of that kind are commercially available. Although such starting wafers are more expensive than bulk lithium niobate substrates, they can lead to the production of microdisks having greatly reduced surface roughness, which can improve the optical performance.

Typical intrinsic quality factors for example modes of our fabricated microdisks in the 1550-nm wavelength range were 20,000-40,000, with a highest measured value of 45,300. This corresponds to a finesse of approximately 500. (The finesse is the quality factor times the free spectral range, divided by the resonant frequency.)

The intrinsic quality factor was found to be lower for shorter wavelengths. The highest measured intrinsic quality factors for the 850-nm and 775-nm wavelength ranges were 37,100 and 3,560, respectively. We attribute this wavelength dependence to increased scattering from surface defects at shorter wavelengths.

High quality factors are important. As reported, for example, in the paper by X. Guo et al. (cited below), the conversion efficiency scales quadratically with the intrinsic quality factor of the pump mode and linearly with the intrinsic quality factor of the SH mode.

System.

Figure 8:
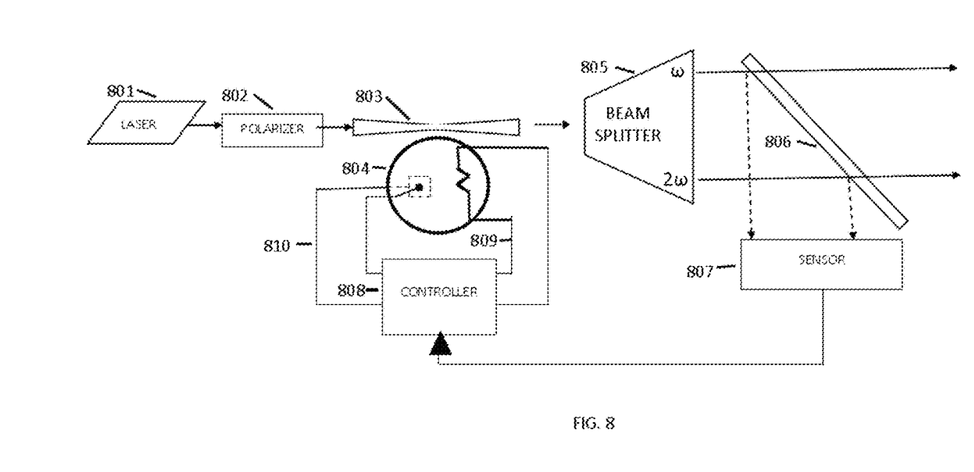
FIG. 8 is a notional block diagram of a system that includes the microresonator, a tapered fiber coupler, a tuning circuit, and a feedback arrangement for controlling the tuning circuit.

FIG. 8 is a notional block diagram of a system that includes the microresonator 804, together with a tapered fiber coupler 803. A tapered fiber is desirable for this purpose because it can strongly couple to microdisk modes, and it can have extremely low insertion losses over very large bandwidths. We have found it useful to dimple the tapered region of the coupler by pressing it against a cylindrical mold and annealing it, thereby creating a bend. This allows the coupler to more easily approach the disk, which is only a few micrometers tall, while remaining physically separated from the chip surface and edges.

The tapered fiber coupler transfers the pump wave into the microresonator. The pump wave from, e.g., a laser source 801 passes through a polarizer 802 before it enters the tapered fiber coupler. As indicated in the figure, the same tapered fiber coupler can be used to transfer light, including the SH light, out of the microresonator. In other embodiments, a second optical coupler can be used for that purpose. Other types of waveguide couplers, such as integrated waveguide couplers, may also be used.

The light that exits the microresonator will include a combination of pump light and SH light. However, these two components will be readily separable if desired, because they have orthogonal polarizations and are hundreds of nanometers apart in wavelength.

Hence any of various polarization-selective and spectrally selective components can be used for such separation. One example is a dichroic beam splitter. Other possibilities include without limitation a plane-parallel etalon, a prism, a birefringent crystal, a fiber Bragg grating, and a polarization-dependent coupler.

The separation of the output beams is represented notionally in the figure by the "beam splitter component" 805, which has a first output beam at frequency f and a second output beam at frequency 2f. Also represented in the figure is an optical tap 806 (shown illustratively as a half-silvered mirror), which directs a portion of each output beam onto a sensor device 807, such as a photodiode device. The sensor device detects the output beams and produces an electrical output signal in response to the detected light.

Active control is desirable for stabilizing the resonant frequencies of the cavity modes at f and 2f. A combination of temperature tuning and electrical tuning can be effective for that purpose. In embodiments, the electrical tuning is a combination of electro-optic tuning and piezoelectric tuning, which deforms or stresses the material of the resonator. FIG. 8 includes representations of a circuit 809 including an electric heater in thermal contact with the microresonator for temperature tuning and a circuit 810 including a pair of electrodes in electrical contact with the microresonator for electrical tuning.

The figure also shows a controller 808, which receives feedback (or "error") signals from the sensor indicating, for example, the power levels or intensities (or potentially, the transmitted phases) in the output beams at the pump and SH frequencies. Based on these feedback signals, the controller applies an appropriate heating current to the temperature-tuning subcircuit 809 and an appropriate bias voltage to the electrical tuning subcircuit 810, for driving the resonant frequencies toward their desired values.

We believe that for at least some frequency pairs at f and 2f, the electrical tuning will shift the respective resonances in opposite directions at different rates, whereas the temperature tuning will shift the resonances in the same direction at different rates.

At least for small adjustments, this combination of effects provides enough control both to place the midpoint between the two resonances where desired, and to separate the two resonances by the desired amount. In other words, it would be possible to choose linear combinations of the two actuators that constitute an orthogonal pair of virtual actuators capable of moving each resonance independently and thus stabilizing the system at both resonance frequencies.

It will be understood from the above discussion that in some cases, an as-manufactured resonator may provide a particular desired phase-matched pair of modes at room temperature without tuning, but in other cases, tuning may be required to provide the desired mode pair. Tuning may also be able to provide several available mode pairs from which to choose, within the same resonator. Accordingly, we will refer to the SH mode in a mode pair as having "substantially twice the frequency" of the other member of the pair if $f_2=2f_1$ without tuning, or if the condition in which $f_2=2f_1$ can be reached through tuning of the resonator.

For at least some applications, it may be advantageous to apply periodic poling in the microresonator so that quasi-phase matching can be combined with the gBPM. This can potentially relax the phase-matching condition, thereby making available a greater range of potential matched mode pairs.

As those skilled in the art will understand, the use of high-Q cavities will increase the intra-cavity optical intensity relative to the input intensity. This poses a danger of photorefractive material damage. It is significant in this regard that compositions of lithium niobate containing at least 4.5% magnesium oxide (MgO) have been shown to withstand optical intensities one hundred times greater than undoped compositions, without exhibiting higher optical absorption. Reference is made in this regard to D. A. Ryan et al., "Magnesium-doped lithium niobate for higher optical power applications", *Optical Engineering*, Vol. 24, No. 1 (1985). Accordingly, it is desirable to use a composition of MgO:LiNbO$_3$ to mitigate the risk of photorefractive damage.

Spontaneous Parametric Down-Conversion.

Spontaneous parametric down-conversion (SPDC) is a useful process for producing entangled photon pairs that can be used in applications such as quantum cryptography. The phase matching condition for degenerate SPDC (i.e., SPDC where the signal and idler photons have the same frequency) is identical to the phase-matching condition for second-harmonic generation. As a consequence, the same system described above can also be used as a bright source of pair photons at what has until now been referred to as the "pump wavelength" $\lambda_1$ by changing the pump laser to the second-harmonic wavelength $\lambda_2$. It should be noted that the damage threshold power at the wavelengths of interest may be considerably lower in such a configuration. This could lead to even stricter limits on available useful pump power. However, doping with magnesium oxide may be effective for increasing the damage threshold.

Numerical Modeling.

We adopted a coupled-mode model to predict the conversion efficiency for doubly resonant SHG in a microdisk. Helpful references in this regard are X. Guo et al., "Second-harmonic generation in aluminum nitride microrings with 2500%/W conversion efficiency," *Optica* 3 (2016) 1126-1131, and A. Rodriguez et al., "$\chi^{(2)}$ and $\chi^{(3)}$ harmonic generation at a critical power in inhomogeneous doubly resonant cavities," *Opt. Express* 15 (2007) 7303-7318.

A distinctive feature of our model is the addition of explicit terms for loss due to coherent backscattering.

The coupled equations describing our system are:

$$\beta_1 = \frac{1}{4} \frac{\int d^3x \sum_{ijk} \varepsilon \chi_{ijk}^{(2)} [E_{1i}^*(E_{2j}E_{1k}^* + E_{1j}^*E_{2k})]}{[\int d^3x \, \varepsilon|E_1|^2][\int d^3x \, \varepsilon|E_2|^2]^{1/2}}$$

$$\beta_2 = \frac{1}{4} \frac{\int d^3x \sum_{ijk} \varepsilon \chi_{ijk}^{(2)} E_{2i}^* E_{1j} E_{1k}}{[\int d^3x \, \varepsilon|E_1|^2][\int d^3x \, \varepsilon|E_2|^2]^{1/2}}$$

where $\alpha_{1,cw}$ and $\alpha_{1,ccw}$ ($\alpha_{2,cw}$ and $\alpha_{2,ccw}$) are the complex cavity field amplitudes of the clockwise and counterclockwise circulating pump (SH) modes, normalized such that $|\alpha|^2$ is the cavity energy in each mode; $\Omega_1$ and $\Omega_2$ are the frequency detuning of the pump and second harmonic from the cavity modes; $\kappa_1$ and $\kappa_2$ are the loss rates of the pump and second harmonic due to scattering, material absorption, and waveguide extraction; $\kappa_{1,w}$ and $\kappa_{2,w}$ are the loss rates due only to waveguide extraction; $\kappa_{BS}$ is the rate of coherent backscattering of the pump mode; and $\omega_1$ and $\omega_2$ are the angular frequencies of the pump and second harmonic.

The quantities $\beta_1$ and $\beta_2$ are nonlinear coupling coefficients. They describe effective nonlinearities based on material nonlinearity and the spatial overlap of the modes. They were calculated using a two-dimensional axisymmetric model to solve for the eigenmodes of the resonator.

The nonlinear coupling coefficients $\beta_1$ and $\beta_2$ were calculated using the following expressions:

$$\frac{da_{1,cw}}{dt} = (i\Omega_1 - \kappa_1)a_{1,cw} + \sqrt{2\kappa_{1,w}}\, s_{1,cw,+} + i\kappa_{BS}a_{1,ccw} + i\omega_1\beta_1 a_{1,cw}^* a_{2,cw}$$

$$\frac{da_{1,ccw}}{dt} = (i\Omega_1 - \kappa_1)a_{1,ccw} + i\kappa_{BS}a_{1,cw} + i\omega_1\beta_1 a_{1,ccw}^* a_{2,cw}$$

$$\frac{da_{2,cw}}{dt} = (i\Omega_2 - \kappa_2)a_{2,cw} + i\omega_2\beta_2|a_{1,cw}|^2$$

$$\frac{da_{2,ccw}}{dt} = (i\Omega_2 - \kappa_2)a_{2,ccw} + i\omega_2\beta_2|a_{2,ccw}|^2,$$

The SH power extracted from the taper probe is $|\sqrt{2\kappa_{2,w}}\alpha_{2,cw}|^2$.

EXAMPLE 1

Numerical Modeling.

A microdisk with thickness 189.4 nm and radius 21.016 μm, with $m_1$=121 ($m_2$=242) was simulated. The TE pump mode and TM second harmonic mode wavelengths were found to be 1544.16 and 772.08 nm. The corresponding electric field profiles were numerically integrated to calculate $\beta_1$=20.29−0.00053i Joule$^{-1/2}$ and $\beta_2$=10.14+0.00026i Joule$^{-1/2}$.

The coupled equations described above were solved numerically in steady-state (i.e., assuming time derivatives of zero), using parameters extracted from experimentally measured transmission spectra. These parameters were:
$\Omega_1$=$\Omega_2$=0; $\kappa_1$=1.77 GHz; $\kappa_2$=42.9 GHz; $\kappa_{1,w}$=0.71 GHz; $\kappa_{2,w}$=13.6 GHz; $\kappa_{BS}$ 2.86 GHz; $\omega_1$=1.22×10$^{15}$ rad/s; $\omega_2$=2.44×10$^{15}$ rad/s.

Due to interference from mechanical instability of the taper probe, we were unable to measure the loss rates $\kappa_{1,w}$ and $\kappa_{2,w}$ directly. Instead, these quantities were fixed by curve-fitting as constrained within the experimentally observed values for the pump resonator mode.

Figure 9:
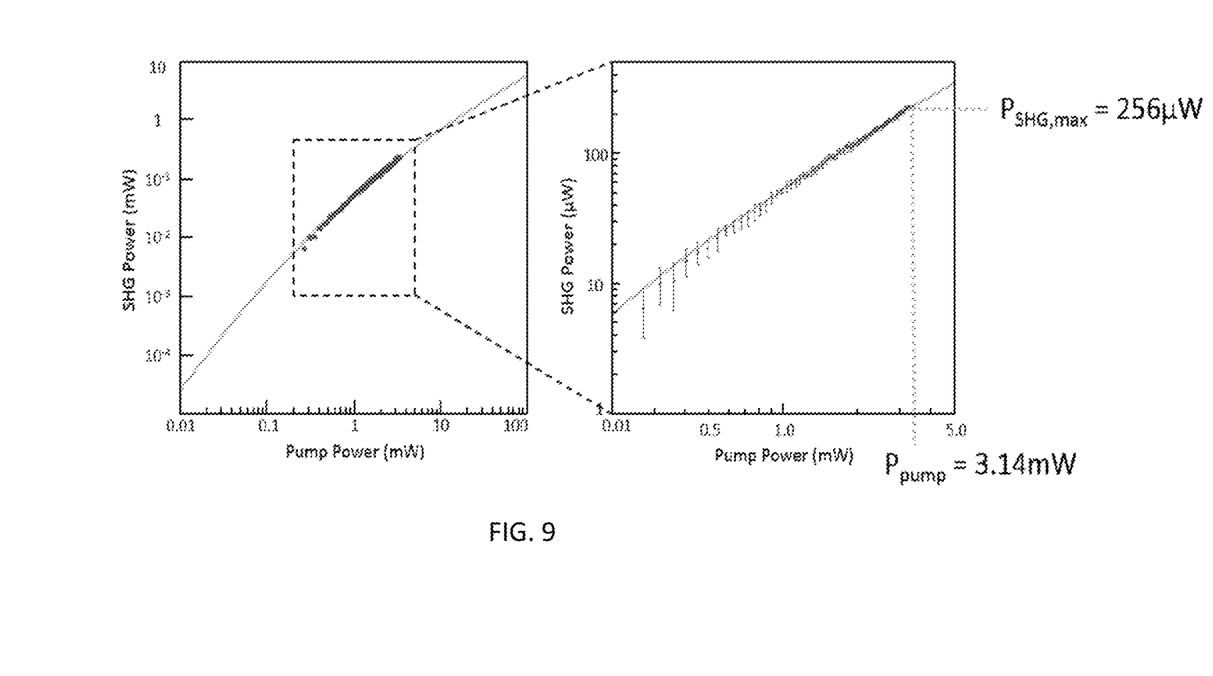
FIG. 9 is a graph of second-harmonic power as a function of pump power in an example microresonator. A solid curve in the figure represents theoretical results obtained from numerical modeling, and plotted data points represent experimental measurements.

Our model predictions are represented by the solid curve in FIG. 9, which plots SH power as a function of the pump power.

Experimental.

The same tapered fiber probe that we used to obtain transmission spectra was also used to pump the microdisk at 1544 nm and extract the SH signal at 772 nm. The experimentally measured SH output power and efficiency are shown as a function of pump power, along with the values predicted by our model, in FIG. 9.

The maximum output power at 772 nm achieved in our experiment was 256 μW at a pump power of 3.14 mW, yielding a conversion efficiency of 7.18%.

As in the above-cited paper by X. Guo et al., our model predicted a "critical" pump power, at which maximum conversion efficiency occurs. The critical power for our system was 10.0 mW, with a conversion efficiency of 7.3%.

However, above approximately 3 mW of pump power, we observed the onset of photorefractive damage. The SHG conversion efficiency was reduced, and it was accompanied by a reduction in the resonator mode quality factors. These changes persisted after reducing the pump intensity.

Annealing the sample at 70° C. for 30 minutes was sufficient to reverse the damage, but the onset of damage prevented us from obtaining reliable SHG results at higher pump powers. Doping the lithium niobate device layer with magnesium oxide (MgO) is expected to increase the optical damage threshold by a factor of approximately 100, which we believe would make it possible to reach the critical power.

EXAMPLE 2

Based on a theoretical study, we have also predicted phase matching in a lithium niobate microdisk at frequencies of 406.2 and 812.4 THz, corresponding to respective wavelengths of 738 nm and 369 nm. Using a simpler numerical model than the one described above (for example, we did not accurately account for coherent backscatter), we modeled a microdisk having a radius of 7.29 μm and a thickness of 97.5 nm. The matched modes had respective azimuthal eigenvalues m of 83 (radial polarization) and 166 (vertical polarization). These values were found by incrementally adjusting the resonator geometry until a phase-matched pair could be found with a ratio of mode numbers arbitrarily close to 2.

This example shows that the generation of second-harmonic light in the near-ultraviolet range is theoretically attainable.

We claim:

1. An optical apparatus for generating an output wave that has a converted frequency of twice or one-half the frequency of a pump wave, comprising:
 a microresonator comprising a nonlinear optical medium having a thickness $\delta$ and having at least a first resonant mode and a second resonant mode; and
 an optical coupler for injecting the pump wave into the microresonator from a pump source, thereby to excite one of said first and second modes;
 wherein:
 the first mode has substantially radial polarization and the second mode has substantially vertical polarization;
 the first and second modes have the same radial order which is an integer at least 1;
 the pump wave and each of said first and second modes has a respective frequency and a respective in-material wavelength for propagation within the nonlinear optical medium;
 the second-mode frequency is substantially twice the first-mode frequency; and
 the thickness $\delta$ is less than one-half the in-material wavelength of the pump wave for propagation within the nonlinear optical medium.

2. The optical apparatus of claim 1, further comprising a tuning circuit coupled to the microresonator and configured to tune the microresonator over an operating range, wherein the second-mode frequency is twice the first-mode frequency at least at one tuning state within the operating range.

3. The optical apparatus of claim 2, further comprising a sensing element optically coupled to an output path from the microresonator and configured to provide an output signal indicative of an optical power level.

4. The optical apparatus of claim 3, wherein the tuning circuit is configured to tune the frequencies of the first and second modes in response to the output signal from the sensing element.

5. The optical apparatus of claim 4, wherein the tuning circuit comprises an electric heater in thermal contact with the microresonator for thermo-optical tuning and a voltage bias electrode in electrical communication with the microresonator for electro-optical tuning.

6. The optical apparatus of claim 1, wherein the thickness $\delta$ is less than 200 nm.

7. The optical apparatus of claim 1, further comprising at least one selective optical element positioned in an output path from the microresonator and configured to separate light having the frequency of the first mode from light having the frequency of the second mode.

8. The optical apparatus of claim 7, wherein the at least one selective optical element comprises a polarization-selective optical element configured to separate TE-polarized light from TM-polarized light.

9. The optical apparatus of claim 7, wherein the at least one selective optical element comprises a wavelength-selective optical element configured to separate light at the first mode frequency from light at the second mode frequency.

10. The optical apparatus of claim 1, wherein the nonlinear optical medium consists essentially of lithium niobate.

11. The optical apparatus of claim 1, wherein the microresonator is a microring, microdisk, or spherical resonator.

12. The optical apparatus of claim 1, wherein the microresonator is a microdisk resonator.

13. The optical apparatus of claim 1, wherein the microresonator is periodically poled.

14. The optical apparatus of claim 1, wherein light from the pump source excites the first mode, thereby to generate second-harmonic light in the second mode.

15. The optical apparatus of claim 1, wherein light from the pump source excites the second mode, thereby to generate down-converted light in the first mode.

16. The optical apparatus of claim 1, wherein the thickness $\delta$ is less than 1/3.5 times the in-material wavelength of the pump wave for propagation within the nonlinear optical medium.

17. A method of optical conversion from a pump wave to an output wave that has a converted frequency of twice or one-half the frequency of a pump wave, comprising:
 injecting the pump wave into a microresonator that comprises a nonlinear optical medium having a thickness $\delta$, wherein the injecting is performed so as to excite a first resonant mode of the microresonator at a first-mode resonant frequency; and
 tuning the microresonator so as to create a tuning state in which a second resonant mode of the resonator has a frequency that is twice or one-half the frequency of the first resonant mode;
 wherein:
 one of said first and second modes has substantially radial polarization and the other has substantially vertical polarization;
 the first and second modes both have the same radial order which is an integer at least 1;
 the pump wave and each of said first and second modes has a respective in-material wavelength for propagation within the nonlinear optical medium; and
 the thickness $\delta$ is less than one-half the in-material wavelength of the pump wave for propagation within the nonlinear optical medium.

18. The method of claim 17, further comprising energizing periodic poling electrodes positioned on the microresonator.

19. The method of claim 17, further comprising:
  sensing at least one optical power level on an output path from the microresonator, thereby to provide a feedback signal; and
  tuning the microresonator in response to the feedback signal.

20. The method of claim 19, wherein the tuning comprises jointly operating an electro-optical tuning circuit and a thermo-optical tuning circuit.

21. The method of claim 17, wherein light from the pump source excites a first resonant mode of the microresonator having one-half the frequency of the second resonant mode of the resonator, thereby to generate second-harmonic light in the second mode.

22. The method of claim 17, wherein light from the pump source excites a first resonant mode of the microresonator having twice the frequency of the second resonant mode of the resonator, thereby to generate down-converted light in the second mode.

\* \* \* \* \*